(12) United States Patent
Ashburn, Jr. et al.

(10) Patent No.: US 8,570,201 B2
(45) Date of Patent: Oct. 29, 2013

(54) DIRECT FEEDBACK FOR CONTINUOUS-TIME OVERSAMPLED CONVERTERS

(75) Inventors: Michael A. Ashburn, Jr., Groton, MA (US); Ayman Shabra, Woburn, MA (US)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

(21) Appl. No.: 13/354,337

(22) Filed: Jan. 20, 2012

(65) Prior Publication Data

US 2013/0021184 A1 Jan. 24, 2013

Related U.S. Application Data

(60) Provisional application No. 61/435,011, filed on Jan. 21, 2011.

(51) Int. Cl.
*H03M 3/02* (2006.01)

(52) U.S. Cl.
USPC .................................................. 341/143

(58) Field of Classification Search
None
See application file for complete search history.

(56) References Cited

U.S. PATENT DOCUMENTS

| | | | |
|---|---|---|---|
| 6,369,744 B1 | 4/2002 | Chuang | |
| 6,604,009 B2 | 8/2003 | Eastty | |
| 7,098,730 B1 * | 8/2006 | Shui | 327/553 |
| 7,119,608 B2 * | 10/2006 | Doerrer | 327/552 |
| 7,405,687 B2 * | 7/2008 | Mitteregger et al. | 341/143 |
| 7,626,527 B1 | 12/2009 | Wang | |
| 2007/0207762 A1 * | 9/2007 | Doerrer | 455/323 |
| 2008/0180292 A1 | 7/2008 | Magrath | |
| 2008/0297385 A1 | 12/2008 | Clara | |
| 2010/0149012 A1 * | 6/2010 | Nguyen et al. | 341/143 |
| 2011/0215955 A1 * | 9/2011 | Motz et al. | 341/110 |

OTHER PUBLICATIONS

Yan, "A Continuous-Time Sigma-Delta Modulator with 88dB Dynamic Range and 1.1MHz Signal Bandwidth", ISSCC 2003, Session 3, Oversampled A/D Converters, Paper 3.5.
Cherry, "Excess Loop Delay in Continuous-Time Delta-Sigma Modulators", IEEE Transactions on Circuits and Systems-II: Analog and Digital Signal Processing, pp. 376-389, vol. 46, No. 4, Apr. 1999.
Paton, "A 70-mW 300-MHz CMOS Continuous-Time Sigma-Delta ADC With 15-MHz Bandwidth and 11 Bits of Resolution", IEEE Journal of Solid-State Circuits, pp. 1056-1063, vol. 39, No. 7, Jul. 2004.
"International Search Report" mailed on May 10, 2012 for International application No. PCT/US12/21935, International filing date: Jan. 20, 2012.

* cited by examiner

*Primary Examiner* — Howard Williams
(74) *Attorney, Agent, or Firm* — Winston Hsu; Scott Margo

(57) ABSTRACT

A continuous-time sigma-delta analog-to-digital converter includes a plurality of integrator stages, in which one of the integrator stages includes a current buffer that drives an integrating capacitor. The analog-to-digital converter includes an outer feedback digital-to-analog converter and an inner digital-to-analog converter. The inner digital-to-analog converter is a current-mode digital-to-analog converter that converts the digital output signal to an analog current feedback signal, which is provided to an output of the integrator stage that includes the current buffer. Both the analog current feedback signal and an input signal provided to the current buffer are integrated by the integrating capacitor.

33 Claims, 13 Drawing Sheets

(a) RZ CT DAC (b) NRZ CT DAC

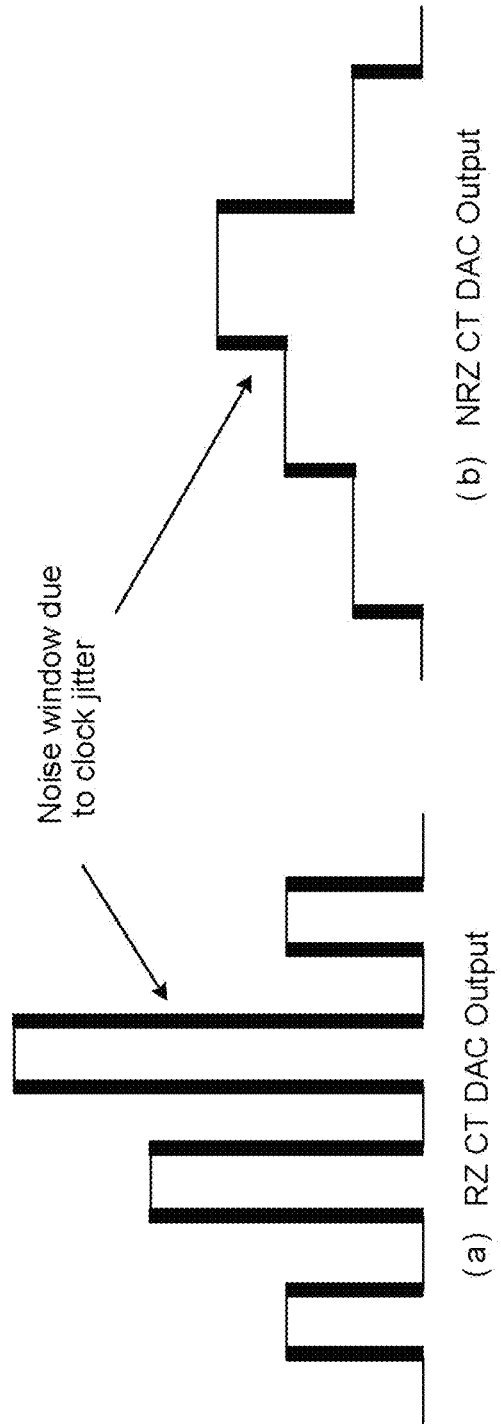

(a) Circuit (b) Block Diagram

DIRECT FEEDBACK FOR CONTINUOUS-TIME OVERSAMPLED CONVERTERS

CROSS REFERENCE TO RELATED APPLICATIONS

This application claims the benefit of U.S. provisional application 61/435,011, filed on Jan. 21, 2011, which is incorporated by reference in its entirety.

BACKGROUND

The present disclosure relates generally to electronics, and more specifically to continuous-time oversampled converters.

Continuous-time analog-to-digital converters (CT ADCs) are distinguished from their discrete-time counterparts (DT ADCs) in that sampling is not used in their front-end circuitry. Rather, in the case of a continuous-time ADC, some form of filtering or analog processing is employed prior to sampling (or storing) the input waveform as part of the eventual digitization. This continuous-time approach has several advantages as compared to using a discrete-time converter. For example, two benefits of using continuous-time analog-to-digital converters are reduced sensitivity to coupled noise and the potential for lower power implementations. In the case of the continuous-time analog-to-digital converter, another benefit is the removal of the requirement for an anti-aliasing filter. Along with its advantages, the continuous-time converter has the disadvantage of increased sensitivity to clock uncertainty in the form of jitter. As a result, the continuous-time implementation requires increased performance requirements for the clock circuitry.

With the ongoing and significant growth in the area of portable electronics, low power is a major if not dominant concern in many consumer electronics as a way to extend battery life, and thereby increase usage time (e.g., talk or playback time). Additionally, as high volume consumer markets continue to drive increasing levels of integration on a single chip, the potential for noise coupling between various blocks has steadily increased the demands for better noise immunity on critical mixed-signal circuitry. Both of these market driven demands have increased the popularity of continuous-time analog-to-digital converters.

SUMMARY

In general, in one aspect, an apparatus includes a continuous-time sigma-delta analog-to-digital converter to convert an analog input signal to a digital output signal. The continuous-time sigma-delta analog-to-digital converter includes a plurality of integrator stages, one of the integrator stages including a current buffer that drives an integrating capacitor. The analog-to-digital converter also includes an outer feedback digital-to-analog converter to provide a feedback signal, and an inner feedback current-mode digital-to-analog converter to convert the digital output signal to an analog current feedback signal that is provided to an output of the current buffer. Both the analog current feedback signal and an input signal provided to the current amplifier are integrated by the integrating capacitor.

Implementations of the apparatus may include one or more of the following features. The plurality of integrator stages can include three integrator stages. The outer feedback digital-to-analog converter can include a non-return-to-zero digital-to-analog converter. The current-mode digital-to-analog converter can include a return-to-zero digital-to-analog converter. The current buffer can receive an input current signal from a transconductance cell (Gm). The current buffer can receive an input current signal from a resistor. The current-mode digital-to-analog converter can include a two-state digital-to-analog converter that includes one or more elements each having two states. The current-mode digital-to-analog converter in the inner feedback loop can include a three-state digital-to-analog converter that has one or more elements each having three states. The outer feedback digital-to-analog converter can be part of an outer feedback loop, the inner digital-to-analog converter can be part of an inner feedback loop. The integrator stage that has the current buffer can generate an output signal that is provided to an input of a quantizer that generates the digital output signal. The integrator stage that has the current buffer can generate an output signal that is provided to another integrator stage. The apparatus can include a dynamic element matching block coupled in series with the outer feedback digital-to-analog converter.

In general, in another aspect, an apparatus that includes a continuous-time sigma-delta analog-to-digital converter is provided. The continuous-time sigma-delta analog-to-digital converter includes a first integrator stage; a second integrator stage to receive an output from the first integrator stage; a third integrator stage to receive an output from the second integrator stage, an outer feedback loop, and an inner feedback loop. The outer feedback loop includes a digital-to-analog converter to convert a quantized output signal to an analog signal that is fed back to an input of the first integrator stage. The inner feedback loop includes a current-mode digital-to-analog converter to convert the quantized output signal to an analog current feedback signal that is provided to an output of one of the integrator stages such that the analog current feedback signal and the input of that integrator stage are both integrated by the integrator stage.

Implementations of the apparatus may include one or more of the following features. The second integrator stage can include a current buffer and an integrating capacitor, and the analog current feedback signal can be provided to the output of the second integrator stage. The third integrator stage can include a current buffer and an integrating capacitor, and the analog current feedback signal can be provided to the output of the third integrator stage.

In general, in another aspect, an apparatus that includes a continuous-time sigma-delta analog-to-digital converter is provided. The continuous-time sigma-delta analog-to-digital converter includes a first integrator stage; a second integrator stage comprising a current amplifier driving an integrating capacitor; an outer feedback loop, and an inner feedback loop. The outer feedback loop includes a first digital-to-analog converter to convert a digital output signal to a first analog feedback signal that is provided to the first integrator stage. The inner feedback loop includes a current-mode digital-to-analog converter to convert the quantized output signal to an analog current feedback signal that is provided to an output of the second integrator stage, in which both the current feedback signal and an input signal of the current amplifier in the second integrator stage are integrated by the integrating capacitor in the second integrator stage.

Implementations of the apparatus may include one or more of the following features. The continuous-time sigma-delta analog-to-digital converter includes a third order continuous-time sigma-delta analog-to-digital converter having an intermediate integrator stage between the first and second integrator stages. The continuous-time sigma-delta analog-to-digital converter can include a fourth order continuous-time sigma-delta analog-to-digital converter having a first intermediate integrator stage and a second intermediate integrator stage between the first and second integrator stages.

In general, in another aspect, a method includes converting an analog input signal to a digital output signal using a continuous-time sigma-delta analog-to-digital converter, the analog-to-digital converter includes a first integrator stage and a second integrator stage, the second integrator stage including a current amplifier that drives an integrating capacitor. Converting the analog input signal to the digital output signal includes converting the digital output signal to a first analog feedback signal that is provided to the first integrator stage; converting the digital output signal to a second analog feedback signal that is provided to an output of the second integrator stage; and integrating, using the integrating capacitor, both an input signal provided to the current amplifier and the second analog feedback signal.

Implementations of the method may include one or more of the following features. The continuous-time sigma-delta analog-to-digital converter can include a third order continuous-time sigma-delta analog-to-digital converter having an intermediate integrator stage between the first and second integrator stages. The continuous-time sigma-delta analog-to-digital converter can include a fourth order continuous-time sigma-delta analog-to-digital converter having a first intermediate integrator stage and a second intermediate integrator stage between the first and second integrator stages. Converting the digital output signal to the first analog feedback signal can include maintaining the analog feedback signal level throughout a clock cycle without setting the signal to zero prior to a next clock cycle. Converting the digital output signal to the second analog feedback signal can include setting the analog feedback signal to zero prior to a next clock cycle. Converting the digital output signal to the second analog feedback signal can include using a two-state digital-to-analog converter that includes one or more elements each having two states. Converting the digital output signal to the second analog feedback signal can include using a three-state digital-to-analog converter that includes one or more elements each having three states. The method can include providing the output of the current amplifier of the second integrator stage to a quantizer that generates the digital output signal. The method can include providing the output of the current amplifier of the second integrator stage to another integrator stage.

In general, in another aspect, a method includes converting an analog input signal to a digital output signal using a continuous-time sigma-delta analog-to-digital converter. The continuous-time sigma-delta analog-to-digital converter includes a plurality of integrator stages, an outer feedback loop, and an inner feedback loop. The method includes reducing a delay in the inner feedback loop by providing a feedback signal of the inner feedback loop as an analog current feedback signal to an output of one of the integrator stages that includes a current buffer and an integrating capacitor, and using the integrating capacitor to integrate the analog current feedback signal together with an input signal to the integrating stage having the current buffer and the integrating capacitor.

Implementations of the method may include one or more of the following features. Providing the feedback signal of the inner feedback loop can include converting the digital output signal to the analog current feedback signal at each clock cycle, and maintaining the analog feedback signal level throughout the clock cycle without setting the signal to zero prior to a next clock cycle. Providing the feedback signal of the inner feedback loop can include converting the digital output signal to the analog current feedback signal at each clock cycle, and setting the analog feedback signal to zero prior to a next clock cycle. The method can include providing the output of the integrator stage having the current buffer and the integrating capacitor to a quantizer that generates the digital output signal. The method can include providing the output of the integrator stage having the current buffer and the integrating capacitor to another integrator stage.

In general, in another aspect, an apparatus includes a continuous-time sigma-delta analog-to-digital converter to convert an analog input signal to a digital output signal. The continuous-time sigma-delta analog-to-digital converter includes a plurality of integrator stages, one of the integrator stages including a current buffer that drives an integrating capacitor; an outer feedback digital-to-analog converter to provide a first feedback signal; and means for converting the digital output signal to an analog current feedback signal that is provided to an output of the integrator stage having the current buffer and the integrating capacitor, and integrating both the analog current feedback signal and an input signal provided to the integrator stage having the current buffer and the integrating capacitor.

BRIEF DESCRIPTION OF THE DRAWINGS

FIG. 10A is a timing diagram showing effects of timing uncertainty in a return-to-zero continuous time digital-to-analog converter.

FIG. 10B is a timing diagram showing effects of timing uncertainty in a non-return-to-zero continuous time digital-to-analog converter.

DETAILED DESCRIPTION

Figure 1:
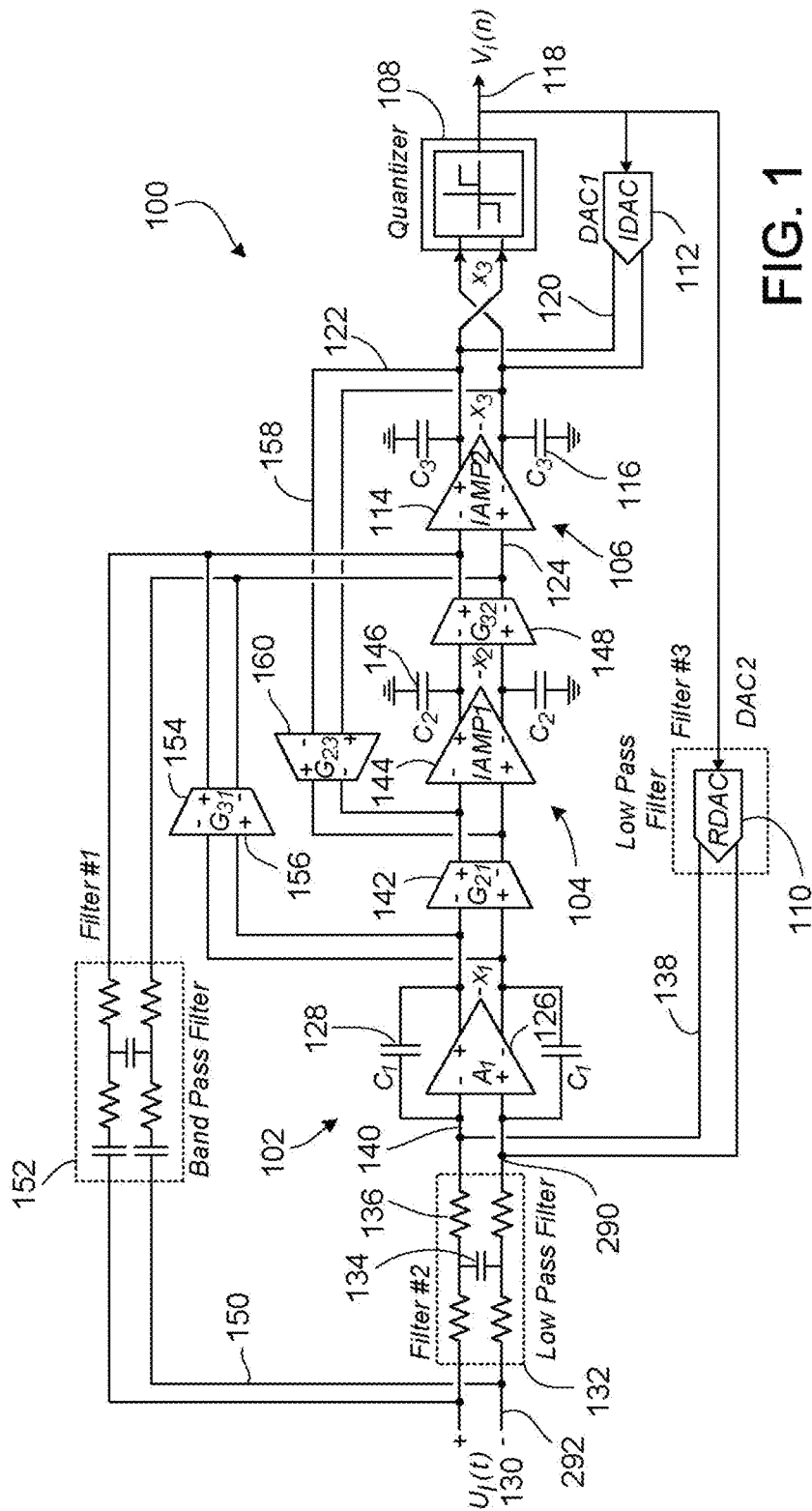
FIG. 1 is a circuit diagram of an example third order continuous-time sigma-delta analog-to-digital converter.

Referring to FIG. 1, in some implementations, a third order continuous-time sigma-delta analog-to-digital converter 100 includes three integrator stages 102, 104, and 106, a quantizer 108, an outer feedback digital-to-analog converter (DAC) 110

(DAC2) and an inner feedback DAC 112 (DAC1). The third integrator stage 106 includes a transconductance (Gm) stage (G$_{32}$) 148, a current buffer (IAMP2) 114, and integrating capacitors (C$_3$) 116. The inner feedback DAC 112 is a current DAC that converts a digital output 118 to an analog current feedback signal 120 that is provided to an output 122 of the third integrator stage 106. In this example, the analog current feedback signal 120 is a differential analog current feedback signal. Both the analog current feedback signal 120 and an input signal 124 provided to the current buffer 114 are integrated by the integrating capacitors 116.

A feature of the analog-to-digital converter 100 is that because the current feedback signal 120 is provided directly to the output of the current buffer 114, the inner feedback path has very little delay. Since the fast inner feedback loop signal does not propagate through the active circuitry in the third integrator stage 106, the speed of the current buffer 114 can be relaxed, which can reduce power consumption.

The first integrator stage 102 includes a voltage amplifier (A$_1$) 126 and feedback capacitors (C$_1$) 128. The first integrator stage 102 receives an input signal U$_f$(t) 130 through a low pass filter 132. The low pass filter 132 includes a capacitor 134 connected across input resistors 136. The voltage amplifier 126, the integrating capacitors 128, and the input resistors 136 form an active RC integrator. The outer feedback DAC 110 converts the digital output 118 to an analog current feedback signal 138 that is provided to the input 140 of the voltage amplifier 126. In this example, the analog current feedback signal 138 is a differential analog current feedback signal. The analog current feedback signal 138 is subtracted from the analog input current 290 and the result is integrated by the first integrator stage 102. In this example, the analog input signal UI(t) is a differential analog signal, and the first, second, and third integrator stages 102, 104, 106 are configured to process differential analog signals.

The output of the first integrator stage 102 is provided to the second integrator stage 104, which includes a transconductance (Gm) stage 142, a current buffer 144, and integrating capacitors 146. The output of the second integrator stage 104 is provided to the third integrator stage 106.

The analog-to-digital converter 100 includes several feed forward and feedback paths. For example, the ADC 100 includes a feed forward path 150 from an input node 292 to the input of the current buffer 114. The feed forward path 150 includes a band pass filter 152 that filters out DC components in the input signal U$_f$(t) 130 to avoid affecting the common mode voltage at the third integrator stage 106. A feed forward path 154 includes a transconductance stage 156 (G$_{31}$) that converts the output of the first integrator stage 102 to a current signal that is provided to the input of the current buffer 114. A feedback path 158 has a transconductance stage 160 (G$_{23}$) that converts the output signal of the third integrator stage 106 to a current signal that is provided to the input of the current buffer 144.

The oversampled continuous-time ADC 100 (or 170, 210) can be, e.g., connected in series with a digital signal processor, or be part of a mixed-signal processing chain. The ADC 100 can be part of a system-on-a-chip that includes analog and digital circuitry. The ADC 100 can be included in any electronic device that uses an analog-to-digital converter, such as an audio encoder or video encoder. The ADC 100 is useful in mobile devices, e.g., mobile phones, laptop computers, and tablet computers.

Figure 2:
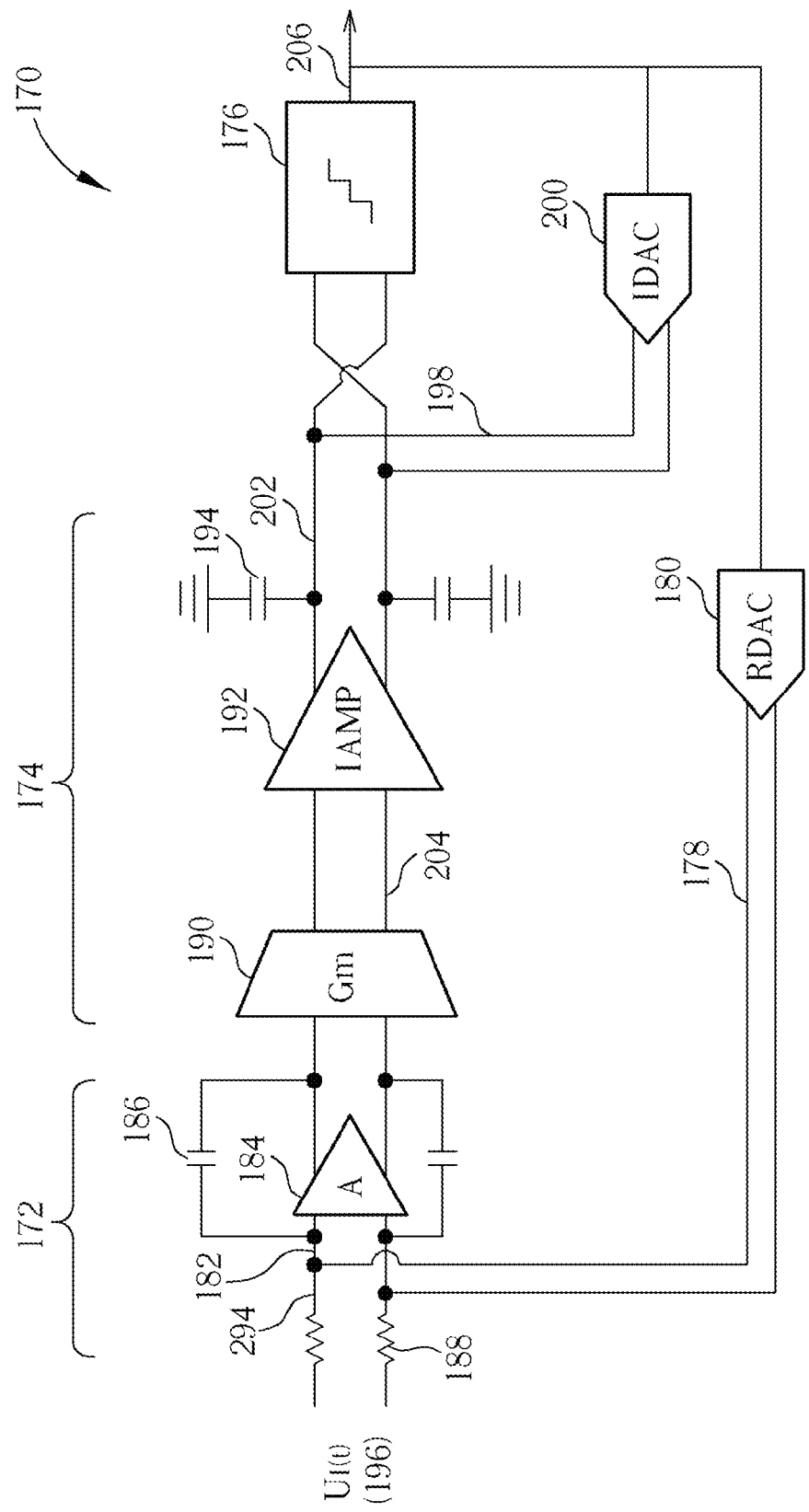
FIG. 2 is a circuit diagram of an example second order continuous-time sigma-delta analog-to-digital converter.

Various modifications can be made to the analog-to-digital converter 100 of FIG. 1. For example, a continuous-time sigma-delta analog-to-digital converter can include only two integrator stages. Referring to FIG. 2, a second order continuous-time sigma-delta analog-to-digital converter 170 includes a first integrator stage 172, a second integrator stage 174, and a quantizer 176. The first integrator stage 172 includes a voltage amplifier 184 and integrating capacitors 186. The first integrator stage 174 receives an input signal U$_f$(t) 196 through input resistors 188. The second integrator stage 174 includes a Gm stage 190, a current buffer 192, and integrating capacitors 194.

An output signal 178 of an outer feedback DAC 180 is provided to the input 182 of the voltage amplifier 184. The output signal 178 of the outer feedback DAC 180 is subtracted from the input current 294, and the result is integrated by the integrating capacitors 186. An output signal 198 of an inner feedback DAC 200 is provided to an output 202 of the current buffer 192. An input signal 204 provided to the current buffer 192 and the output signal 198 from the inner feedback DAC 200 are integrated by the integrating capacitors 194. The integrated result is quantized by the quantizer 176, which generates a digital output 206. The analog-to-digital converter 170 may include additional feed forward and/or feedback paths that are not shown in the figure.

Figure 3:
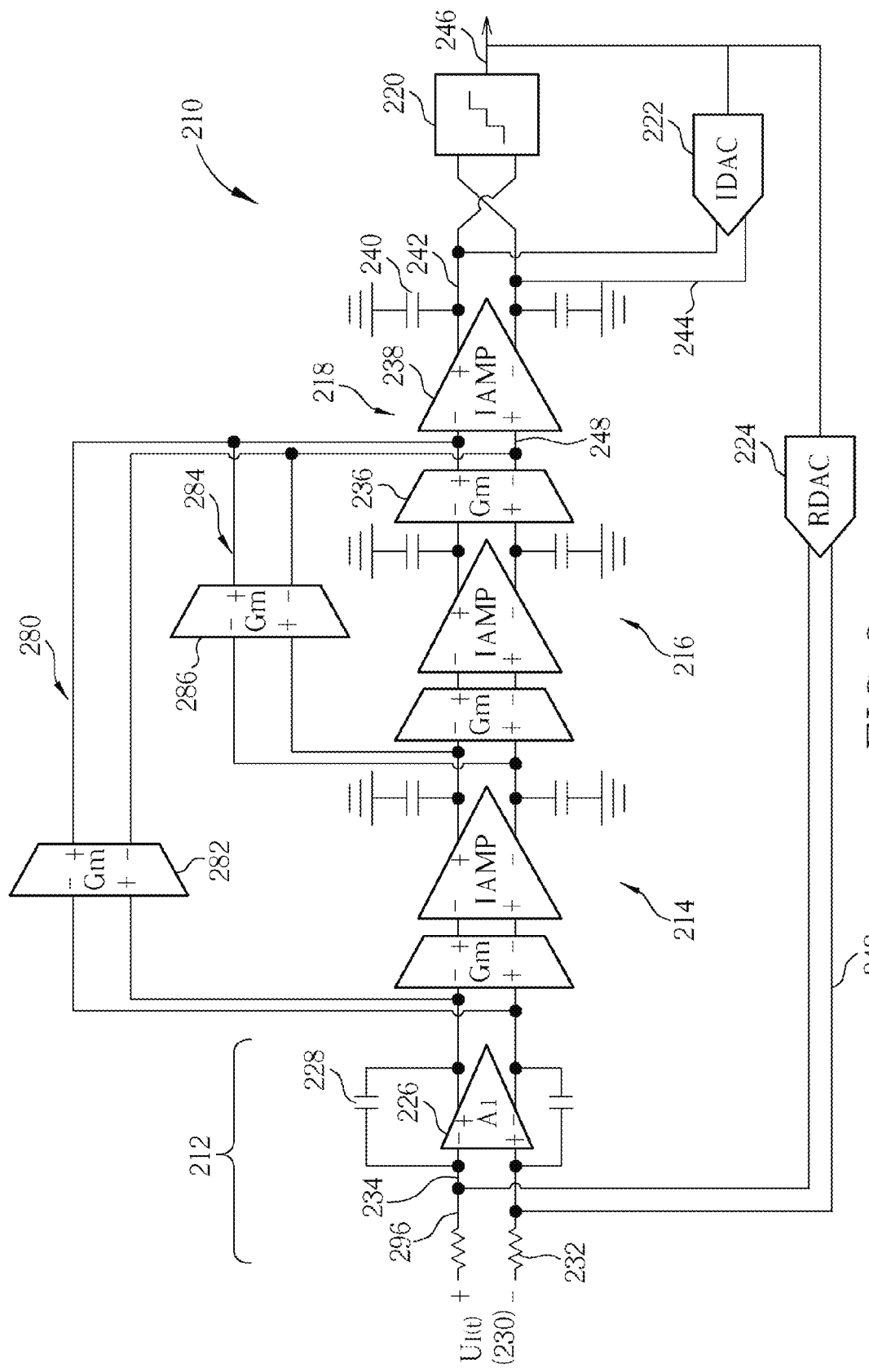
FIG. 3 is a circuit diagram of an example fourth order continuous-time sigma-delta analog-to-digital converter.

For example, a continuous-time sigma-delta analog-to-digital converter can include four integrator stages. Referring to FIG. 3, a fourth order continuous-time sigma-delta analog-to-digital converter 210 includes a first integrator stage 212, a second integrator stage 214, a third integrator stage 216, a fourth integrator stage 218, and a quantizer 220. The first integrator stage 212 includes a voltage amplifier 226 and integrating capacitors 228. The first integrator stage 212 receives an input signal U$_f$(t) 230 through input resistors 232. Each of the second and third integrator stages 214, 216 includes a Gm stage, a current buffer, and integrating capacitors. The fourth integrator stage 218 includes a Gm stage 236, a current buffer 238, and integrating capacitors 240.

A feed forward path 280 that includes a Gm stage 282 is provided between the output of the first integrator stage 212 and the input of the fourth integrator stage 218. A feed forward path 284 that includes a Gm stage 286 is provided between the output of the first integrator stage 212 and the input of the fourth integrator stage 218.

An output signal 242 of an outer feedback DAC 224 is provided to the input 234 of the voltage amplifier 226. The output signal 242 of the outer feedback DAC 224 is subtracted from the input current 296, and the result is integrated by the integrating capacitors 228. An output signal 244 of an inner feedback DAC 222 is provided to an output 242 of the current buffer 238. An input signal 248 provided to the current buffer 238 and the output signal 244 from the inner feedback DAC 222 are integrated by the integrating capacitors 240. The integrated result is quantized by the quantizer 220, which generates a digital output 246. The analog-to-digital converter 210 may include additional feed forward and/or feedback paths that are not shown in the figure.

The techniques described above can also be used in so called hybrid sigma-delta analog-to-digital converters. Sigma-delta converters are nominally broken down into different categories based on their specific implementations: discrete-time or continuous-time. If sampling techniques are used at the front end of the converter, the architecture is referred to as discrete-time. In the discrete-time implementation, analog data is processed in fixed (discrete) time intervals. Within each clock period (or half clock period), the analog components completely settle to within a defined error tolerance. This requirement in turn sets the specification for the bandwidth (speed) of critical analog components within the converter.

If the input to the converter is not sampled, but rather processed continuously through one or more analog stages, it is deemed a continuous-time converter. With this implementation, complete settling is not required each clock period (or half clock period) and as a result the speed requirements for the analog blocks within this implementation can be relaxed relative to discrete time converters. This then provides the opportunity for power savings. Some other benefits of the continuous time architecture relative to discrete time converters include enhanced immunity to coupled noise and also removal of the need for an anti-aliasing filter placed in front of the converter. These benefits coupled with the growing demand for portable consumer applications (where power consumption is critical) have made continuous time converters very popular today.

Some sigma-delta converters incorporate both continuous time and discrete time stages. Some sigma-delta converters use sampled and continuous-time approaches within the same stage, such as with a continuous-time input path and a switched-capacitor (discrete time) feedback DAC. Typically, the converter is called continuous-time if the input path is continuous. However, sometimes if discrete time feedback is used and/or later stages are discrete time, the converter may be referred to as "hybrid." The technique of using a current buffer and integrating capacitors in the last integrator stage, sending an analog current feedback signal from an inner feedback current-mode digital-to-analog converter to the output of the current buffer, and integrating both the analog current feedback signal and an input signal provided to the current buffer by the integrating capacitor, can also be applied to such hybrid sigma-delta analog-to-digital converters. As long as at least one continuous-time circuit is used within the converter, the technique described above can be applied.

For comparison, the following describes examples of sigma-delta analog-to-digital converters that may have larger delays in the inner feedback loop, as compared to the examples shown in FIGS. 1 to 3.

Sigma-Delta (Σ-Δ) converters can be used to achieve high signal-to-noise ratios (SNR) using analog components with relatively low resolution that can operate at higher speeds than the signal band of interest. This is accomplished by trading off bandwidth for resolution. Specifically, this technique is referred to as oversampling. As an example, a 13-bit (having a SNR of about 78 dB) ADC with 2 MHz bandwidth can be implemented using a 3-bit quantizer (sub-ADC) and 3-bit DAC, both operating at 250 MHz. This tradeoff can be advantageous in many applications, such as communications, audio, and industrial circuitry.

Figure 4:
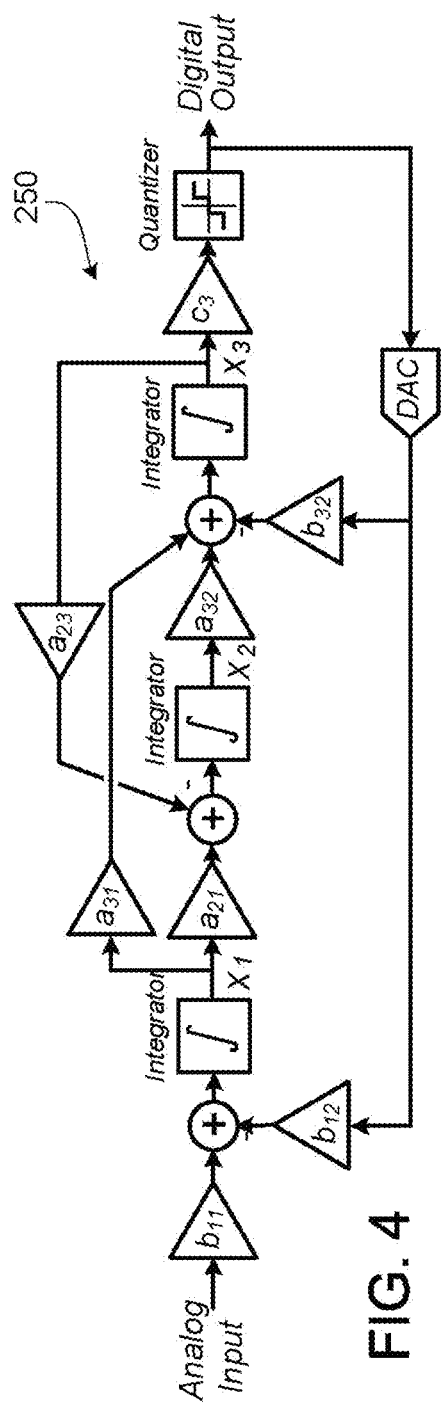
FIG. 4 is a block diagram of an example of a continuous-time sigma-delta analog-to-digital converter.

FIG. 4 shows a block diagram of an example of a continuous time sigma-delta analog-to-digital converter 250. The feedback digital-to-analog converter (DAC) is subtracted from the scaled input (Analog Input). The result is then integrated (Integrator 1) and passed to a second stage for further processing. Multiple integrator stages, feed-forward, and feedback paths are used to form a desired transfer function for both the input and for the quantization noise that results from the finite resolution of the quantizer and DAC. Different combinations of integrators, feed-forward, feedback, and scaling are used for various design requirements. As a result, different converters may have less or more stages and/or connections than shown in the figure.

Figure 5:
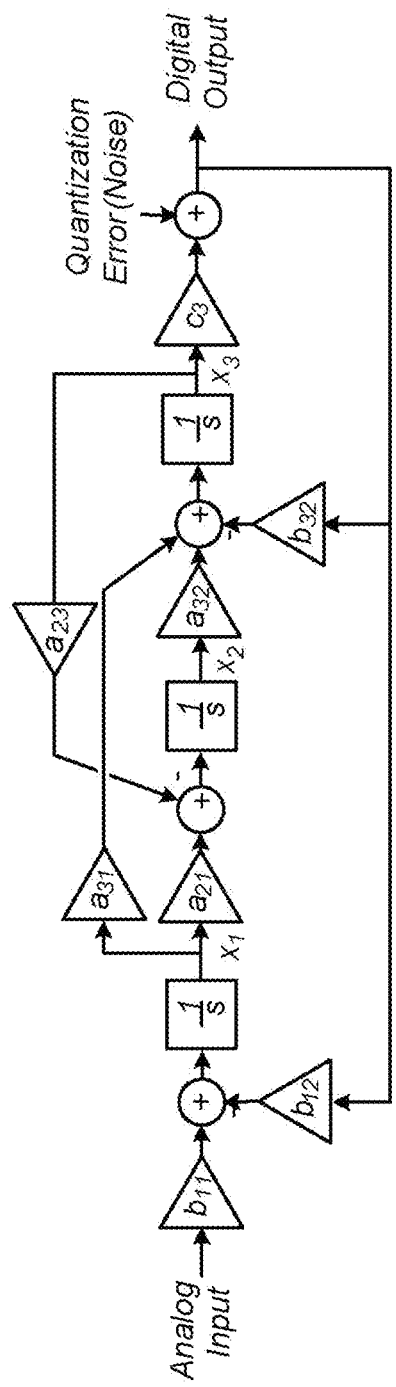
FIG. 5 is a diagram of a linear model for the continuous time sigma-delta analog-to-digital converter of FIG. 4.
Figure 6:
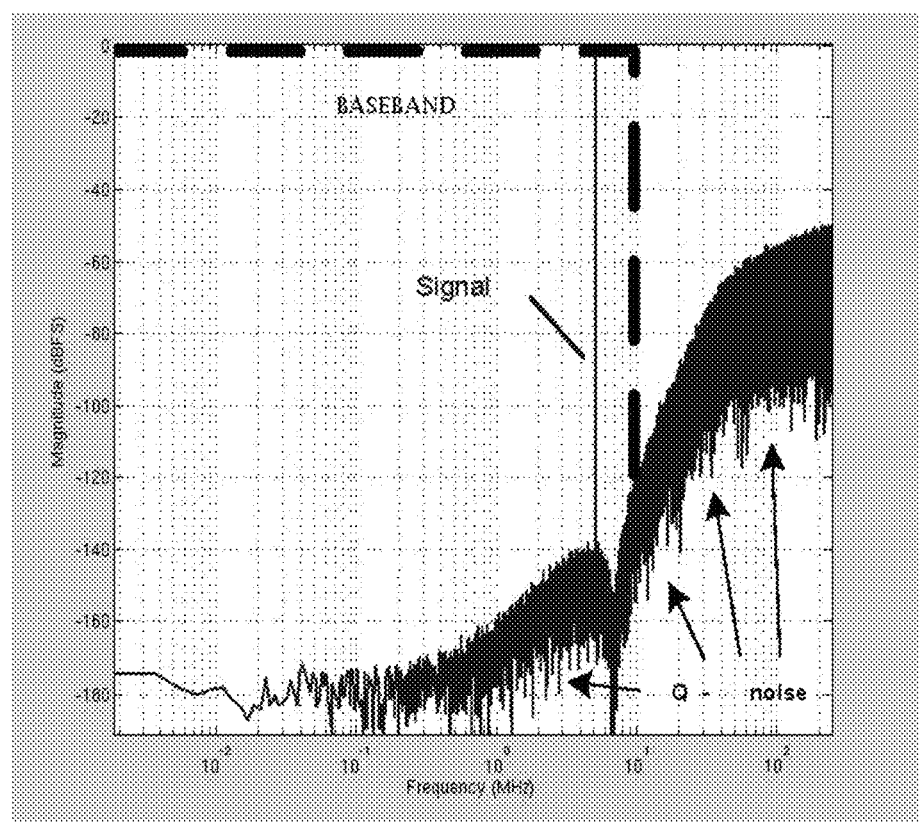
FIG. 6 is a graph of an example output spectrum for the continuous time sigma-delta analog-to-digital converter of FIG. 4.

The linear model for the continuous time converter of FIG. 4 is shown in FIG. 5. Here, the quantizer, used to digitize the analog signal, is replaced by a unity gain stage and a quantization error input. The injection of quantization error models the effect of finite resolution in the quantizer and DAC. This linear model can be solved for the transfer function of the quantization noise to the output of the converter. With proper design, the quantization noise can be "shaped" such that its frequency content is mostly placed outside of the frequency range of interest. An example output spectrum for the converter is shown in FIG. 6. Here, the baseband is at low frequencies (i.e. from DC to whatever bandwidth is required). The quantization noise is therefore shaped with a high-pass characteristic such that it can easily be removed with post-processing using a low-pass filter. Sigma-delta converters can also be implemented for band-pass applications when the frequency range of interest does not extend all the way down to DC.

Figure 7:
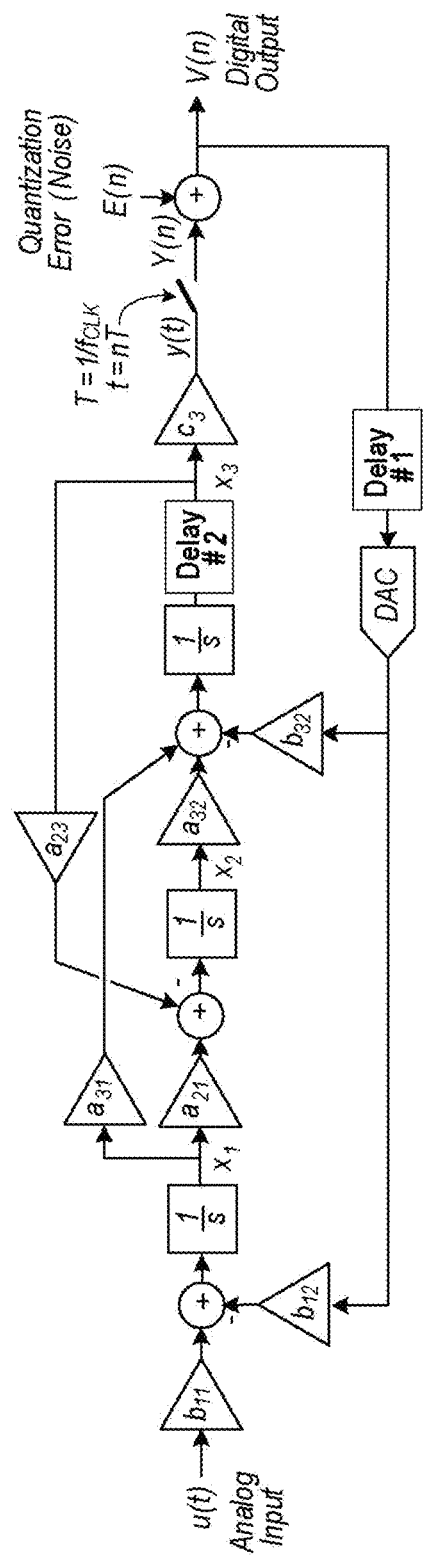
FIG. 7 is a diagram of a linear model of the continuous time sigma-delta analog-to-digital converter of FIG. 4.

FIG. 7 is a more detailed linear model of the previous continuous time converter showing the sampling at the quantizer. Additionally, some delays have been added to the loop, the effects of which will be described below. As shown in the figure, the sampling point in the continuous time converter is (effectively) at the input to the quantizer. To this point the signal can be considered analog. The output of the feedback DAC, which is continuous, is subtracted from the analog (continuous time) input and processed by the loop filter. The quantizer generates its output based by its input value y(t) sampled at finite points in time [y(nT)]. In the figure, this sampling is modeled by the switch placed before the quantizer. The DAC performs the DT-to-CT conversion as its output is continuously applied.

In the linear model of FIG. 7, the output V(z) can be derived as a function of the input U(z) and quantization noise E(z). Z-domain analysis is be used here, which represents the use of Laplace transforms. The output V(z) can be divided into two components, one resulting from the input U(z) and one resulting from the quantizer error E(z). The output can be written as:

$$V(z)=STF(z)U(z)+NTF(z)E(z)$$

where STF and NTF are the Signal Transfer Function and Noise Transfer Function, respectively. The forward path from the input U(z) to the output V(z) contains integrators, while the feedback from the output back to the input is direct (through the DAC). This produces a low-pass characteristic for the STF and a high-pass characteristic for the NTF. It is this high-pass characteristic of the NTF that is used to place the error from the quantizer at frequencies outside of the frequency range of interest (FIG. 6) in order that it can more easily be reduced with a filter placed after the converter.

To achieve a specific NTF to obtain optimal noise shaping over frequency, the dynamics of the loop filter (composed of the integrators, DAC, feed-forward and feedback paths of the converter) are designed to produce the desired response at specific points of time. As shown in FIG. 7, the input to the quantizer is sampled at discrete points in time that are multiples of the clock period. It is the values of y(t) at these points in time [y(nT), where n is an integer] that affect the noise shaping.

The effect of excess loop delay in the converter, modeled in FIG. 7 as delay blocks, is affected by the type of DAC that is used, specifically whether it is a return-to-zero (RZ) or non-return-to-zero (NRZ) DAC. Using a RZ DAC, the output is only applied for a portion of a clock cycle (typically ½ a clock cycle) and then returned to zero input for the remainder of the clock cycle. A NRZ DAC does not return-to-zero, but rather, its output remains constant over a full clock period. Since a RZ DAC is zero for a portion of each clock cycle, a larger output value is required to generate the same average value as a NRZ DAC.

Figure 8A:
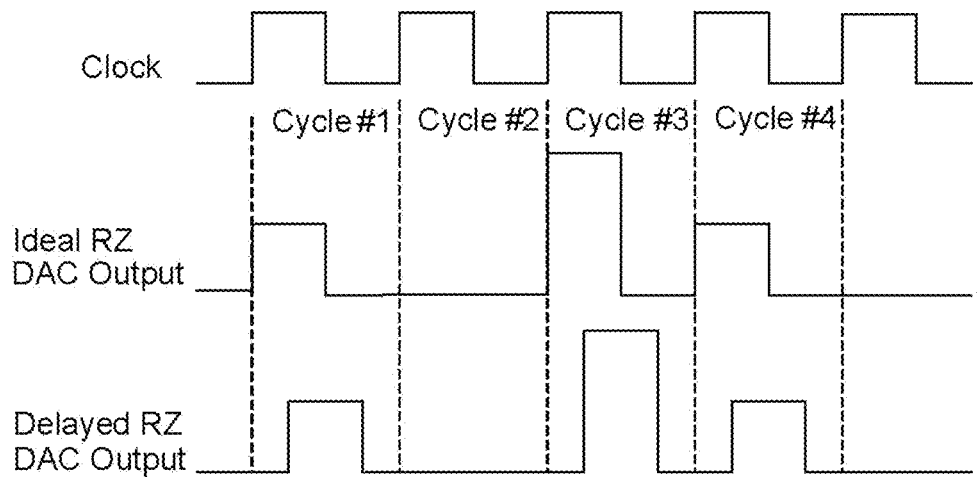
FIG. 8A shows timing diagrams illustrating the effects of excess loop delay for a return-to-zero continuous-time digital-to-analog converter.
Figure 8B:
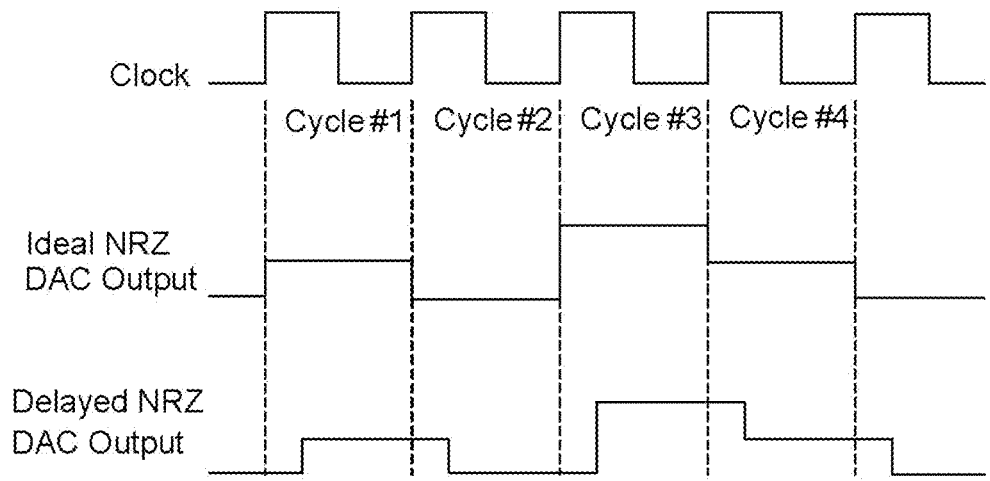
FIG. 8B shows timing diagrams illustrating the effects of excess loop delay for a non-return-to-zero continuous-time digital-to-analog converter.

The different effects of excess loop delay as related to DAC implementation are illustrated in FIGS. 8A and 8B. For a RZ DAC, the DAC feedback pulse is shifted by the excess loop delay, but can still be (completely) applied within the same clock period in which it was initiated (FIG. 8A). For this to occur, the total delay has to be equal or less than ½ clock cycle, assuming the duty cycle of the RZ DAC is 50%. In contrast, with any excess loop delay a NRZ DAC will at least have some portion of its output waveform applied during the following clock cycle, as shown in FIG. 8B.

When targeting an optimal NTF, there are important ramifications of a feedback pulse being delayed such that some portion lies within the following clock cycle. As noted previously, the response to a quantization noise input is targeted for certain values at specific points in time in order to achieve optimal quantization noise shaping. If part of a DAC feedback pulse is delayed to a subsequent cycle, the value of the DAC pulse is increased, or the gain of some other feedback path within the converter is changed, such that the desired value is achieved at the input to the quantizer after a single clock cycle. Once loop delays are determined, this can be achieved by adjusting the coefficients of the loop filter (e.g., $A_{21}$, $A_{31}$, $B_{12}$ shown in FIG. 7) to achieve the desired response in the NTF. The same adjustment technique is also used when an RZ DAC pulse is shifted. However, when a portion of the feedback pulse is shifted into the following cycle, this needs to be compensated. Depending on the location within the converter, a new feedback loop may need to be added to the converter to offset this effect.

Figure 9:
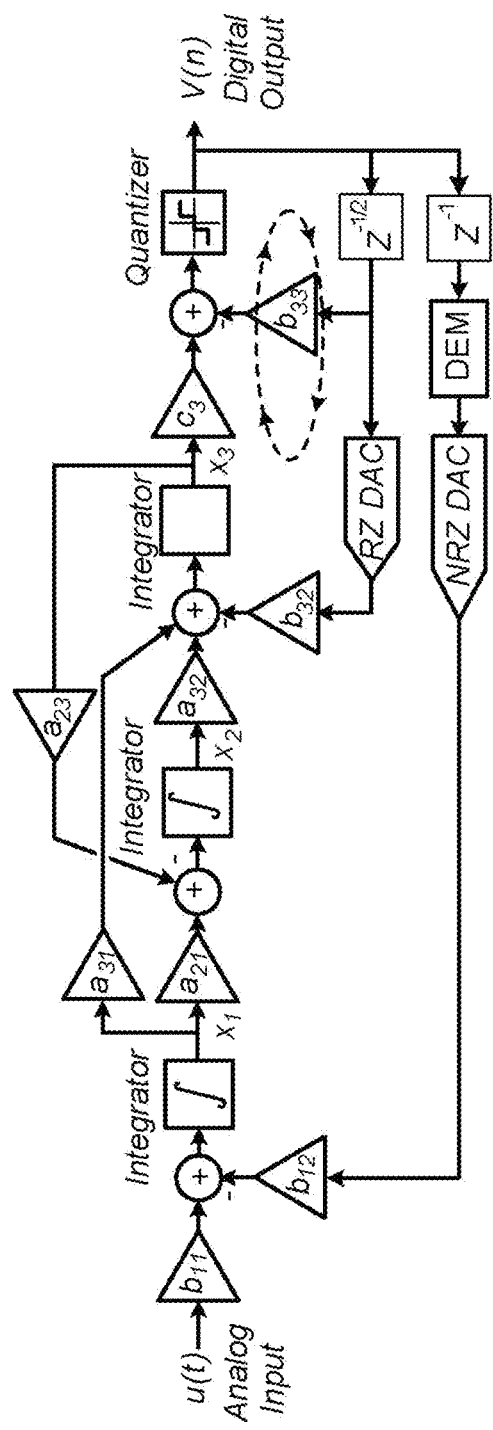
FIG. 9 is a block diagram of an example continuous time sigma-delta analog-to-digital converter employing excess loop delay compensation.

An example of a continuous time converter employing excess loop delay compensation is shown in FIG. 9. This converter is a possible implementation for the converter block diagram of FIG. 7. Referring back to FIG. 7, Delay #1 models the delay of the dynamic element matching block (DEM) along with the quantizer settling time. Delay #2 models the delay in the $3^{rd}$ integrator stage. FIG. 9 includes a one-cycle ($z^{-1}$) delay in order to model the delays due to the quantizer and DEM. There is only a half-cycle delay ($z^{-1/2}$) in series with the RZ DAC since DEM is not used.

In FIG. 9, two DACs are used: one in the outer feedback path feeding back to the first stage of the converter and another feeding back to the input of the third integrator stage. The two DACs are referred to as the Outer FB DAC and Inner FB DAC, respectively. The outer feedback DAC uses a NRZ implementation, while the inner FB DAC uses a RZ technique. The NRZ is used for the outer FB DAC in order to minimize the effects of timing uncertainty (shown in FIGS. 10A and 10B) as well as reduce the switching activity of the DAC. The former reduces baseband noise, improving SNR, while the latter reduces the bandwidth requirement on the first amplifier, enabling power savings. NRZ is not needed on the inner feedback since the increased noise resulting from jitter is rejected by the large low-frequency gain of the integrators located before the third stage. This enables a RZ DAC to be used in the third stage which has benefits in terms of loop delay compensation, described below.

Returning to FIG. 9, dynamic element matching (DEM) is placed in series with the Outer FB DAC. This is essential for mitigating the effects of mismatch in the DAC elements, but it adds a delay to the feedback path. As noted previously, this delay along with any other delays in the outer feedback loop can be compensated by adjusting the gain in the different loop coefficients of the converter and the Inner FB DAC. Since the inner FB loop has fewer integrators (e.g., one), adjusting the gain through this path can be used to compensate for delays in the slower outer loop.

Compensating for delays in the inner FB loop can be more problematic when compared with the slower outer FB loop. The inner feedback loop, highlighted in FIG. 9 with a dashed line, needs to have single-cycle response. Within one clock cycle, there should be a response at the input to the quantizer from a quantization noise input on the previous cycle. Relatively little delay can be tolerated within this faster inner loop. One method that is used to compensate for delays in the inner loop is to add a feedback path that feeds back to the input of the quantizer directly. This path is shown as gain path $b_{33}$ in the figure. Since this path feeds back directly to the quantizer, discrepancies in the single-cycle feedback resulting from delays in the (main) inner loop path can be compensated using this extra feedback path. Disadvantages to this approach are the additional DAC that is used along with any other circuitry for implementing the extra feedback leg.

There is an additional concern of delays that vary with process, temperature, and voltage. Such delays can compromise the performance of the converter both through SNR (signal-to-noise ratio) degradation, peaking in the STF, and reduced stability in the closed-loop system. For these reasons, it is desirable to minimize any propagation delays that are not gated by the clock (i.e. ones that can vary with process, voltage, temperature).

Figure 11A:
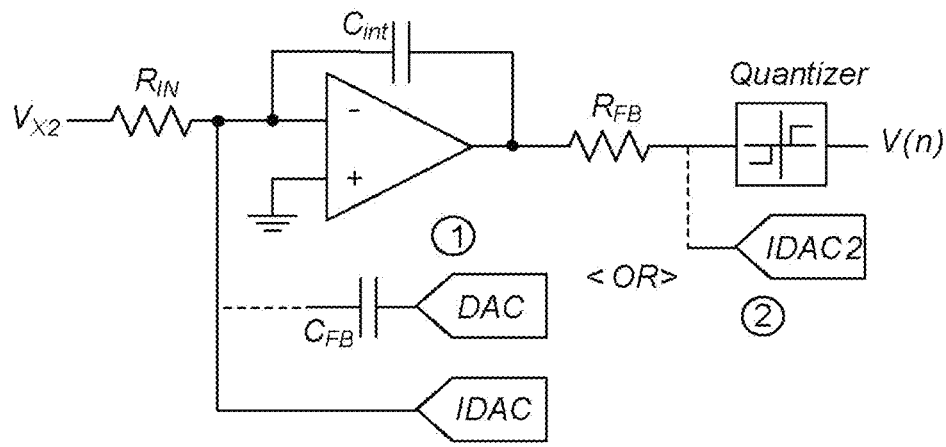
FIGS. 11A to 11E are circuit diagrams showing implementations of the extra feedback paths.

FIGS. 11A To 11E show implementations of the extra feedback path ($b_{33}$, FIG. 9) as applied to the converter example in FIG. 9. The circuits shown in FIGS. 11A to 11E include the 3rd integrator stage, the quantizer, and the additional circuitry used to implement the extra feedback path to the input of the modulator. Some of the figures show multiple possibilities for implementation of the extra feedback path. FIG. 11A uses an active RC-integrator. Here, two options are shown for implementing the extra feedback path: (1) A voltage DAC is fed to the summing junction of the amplifier through a capacitor, $C_{FB}$, and (2) an IDAC feeds across a resistance placed at the output of the integrator.

Figure 12:
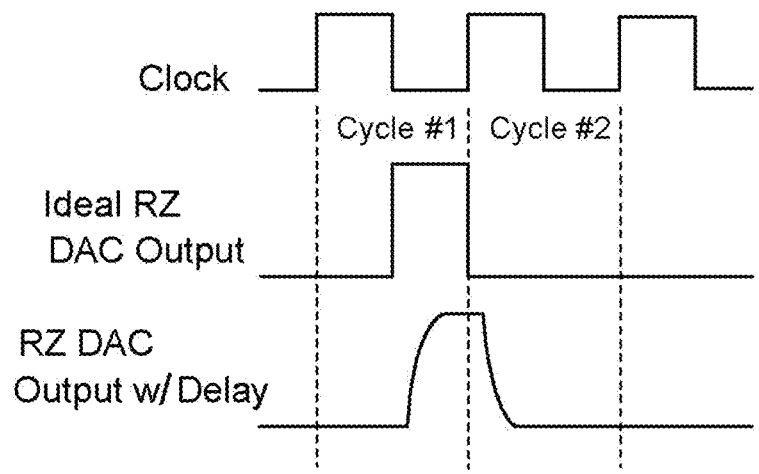
FIG. 12 show timing diagrams illustrating delay resulting from finite response through an amplifier stage.

For option (1) of FIG. 11A, since the DAC voltage is coupled through a capacitor to the summing junction of the amplifier, there is no integration on this path to the quantizer. Therefore the DAC voltage is effectively placed at the output of the stage and input to the quantizer. Although the signal is not integrated across the stage, there can be some delay resulting from finite response through the stage. An example of this effect is show in FIG. 12. The ideal RZ DAC output is applied over ½ of a clock cycle. However, due to finite circuit response times and small delays in the feedback path, the actual DAC output can be shifted and somewhat filtered by the time it reaches the first stage output. This has the same effect as noted previously whereby the NTF is altered from its desired value. This can be somewhat compensated by adjusting loop coefficients, however variations in the speed of the path can still degrade performance.

Figure 11B:
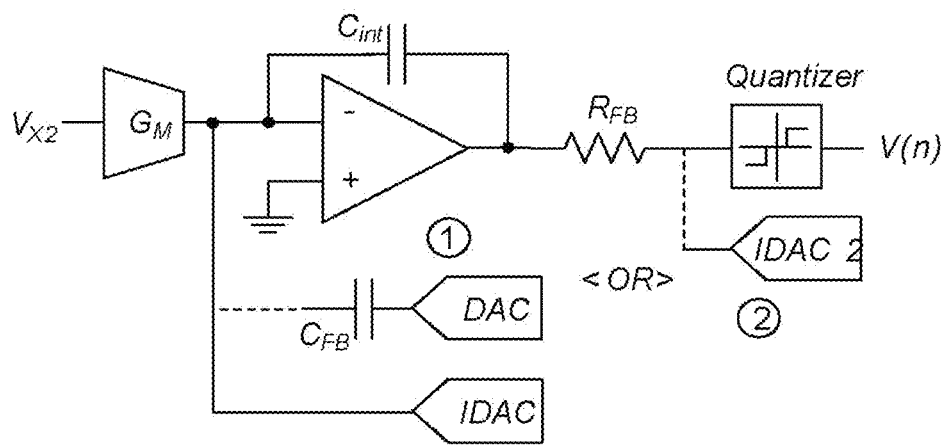

For option #2 of FIG. 11A, the current from a second DAC is fed through a resistance placed at the output of the active integrator stage. The voltage drop is then generated across the resistor, effectively summing the (second) DAC signal with the output of the integrator stage. The costs of this approach are the extra power and die area of the second DAC, and possibly extra phase delay resulting from the added resistance. The example shown in FIG. 11B is similar to that of FIG. 11A, except that a Gm-cell has replaced the resistor input to the active integrator. Either option #1 or #2 of FIG. 11B can be applied to generate the direct feedback to the quantizer input.

Figure 11C:
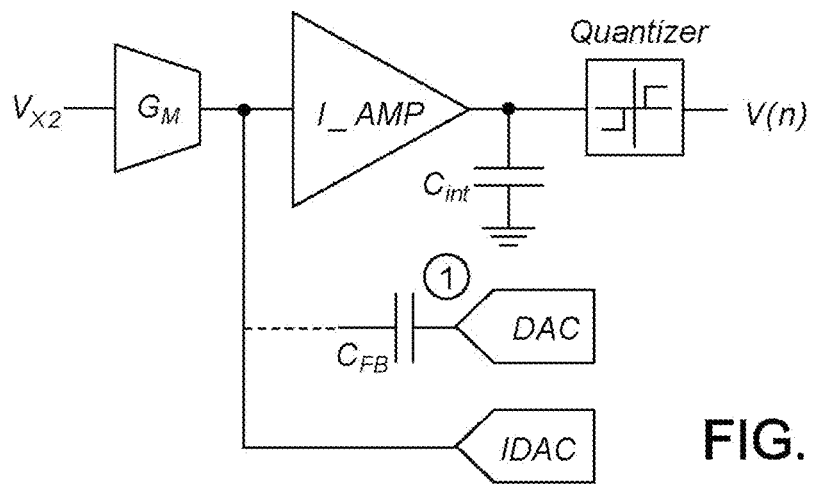
Figure 11D:
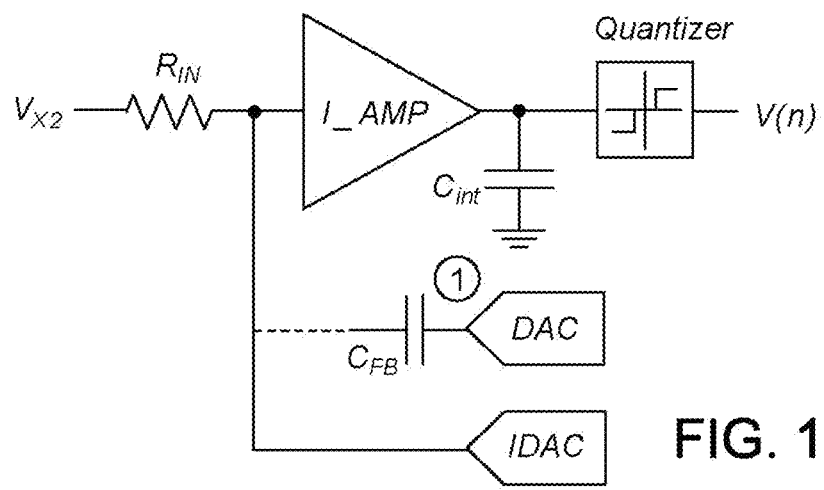

FIGS. 11C and 11D show implementations using a current amplifier driving the integrating capacitors directly, thereby forming a transimpedance amplifier (TIA) stage. The difference between the two implementations is that the example of FIG. 11C uses a Gm-cell input whereas the example of FIG. 11D uses a resistive input. The capacitively coupled DAC (option #1) can still be used for this configuration as a means to provide a feedback path to the quantizer input.

Figure 11E:
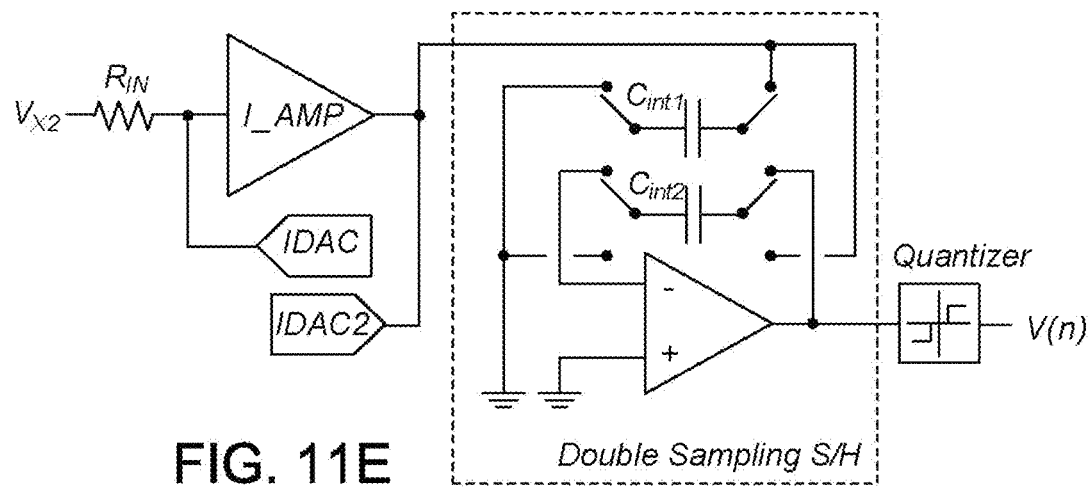

FIG. 11E shows an option in which a sample-and-hold (S/H) is placed at the output of a current amplifier integrator stage. A current DAC is connected at the output of the amplifier, which is also the input to the S/H. Here, the output of a second DAC is summed with the output of the amplifier and fed into a S/H circuit. The sample/hold circuit captures the output and stores it for processing by the quantizer. This implementation has the disadvantage of requiring a separate DAC and amplifier stage, increasing power and die area. In addition, the sampling process across the capacitors is susceptible to noise pickup through the voltage supplies and/or substrate.

Comparing the examples shown in FIGS. 11A to 11E to the examples shown in FIGS. 1 to 3, the examples in FIGS. 1 to 3 have less delay in the inner feedback loop because the feedback in the inner feedback loop is achieved with a current mode DAC feeding directly to the output of the current buffer in the last integrator stage. By reducing the delay in the inner feedback path, additional compensation is not required. Because the feedback path is connected directly to the integrating capacitors, the bandwidth of the current buffer may be relaxed, which may result in reduced power requirements. In the examples of FIGS. 1 to 3, while the actual feedback circuitry connects to the output of the current buffer, the feedback current is still integrated.

Figure 13A:
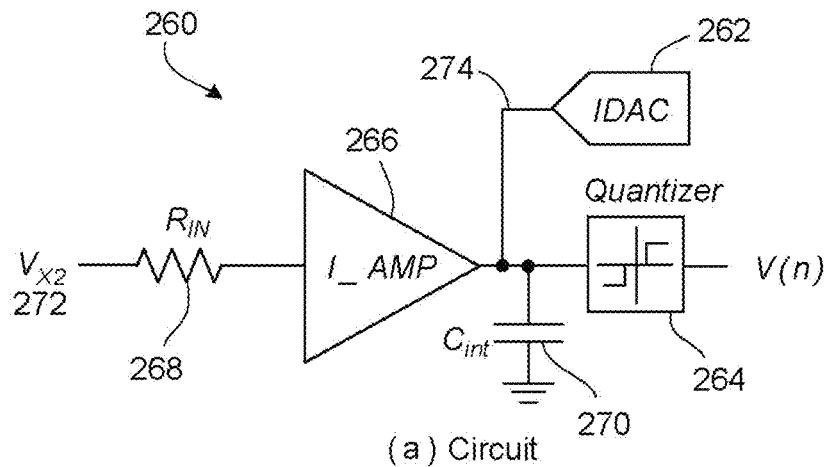
FIG. 13A is a schematic diagram of an integrator stage.
Figure 13B:
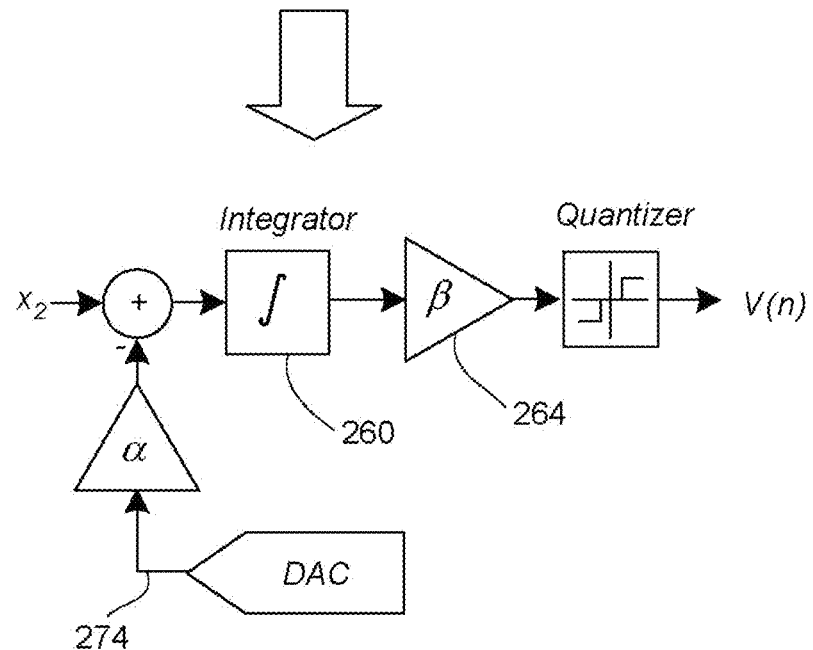
FIG. 13B is a block diagram of the circuit of FIG. 13A.

FIG. 13A shows a circuit diagram of a portion of a continuous-time sigma-delta analog-to-digital converter, which includes an integrator stage 260, a current digital-to-analog converter 262, and a quantizer 264. The integrator stage 260 includes a current buffer 266, an integrating capacitor 270, and an input resistor 268. The integrator stage 260 is similar to the last integrator stages of the examples of FIGS. 1 to 3, except that in the example of FIG. 13A, the Gm cell input to the current buffer is replaced with a resistor input 268. FIG. 13B shows a block diagram of the circuit in FIG. 13A. Because the integrating capacitor 270 of the integrator stage 260 integrates both the input signal $V_{X2}$ 272 to the integrator stage 260 and the analog current feedback signal 274 from the current digital-to-analog converter 262, the feedback signal 274 is shown as being provided to the input of the integrator 260 in FIG. 13B.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

For example, in the analog to digital converter 100 of FIG. 1, the low pass filter 132 can be replaced by resistors, and the band pass filter 152 can also be replaced by resistors. A continuous-time sigma-delta analog-to-digital converter can include more than four integrator stages. In each of the examples in FIGS. 1 to 3, a dynamic element matching block can be coupled in series with the outer feedback digital-to-analog converter.

Accordingly, other implementations are within the scope of the following claims.

What is claimed is:

1. An apparatus comprising:
    a continuous-time sigma-delta analog-to-digital converter to convert an analog input signal to a digital output signal, the continuous-time sigma-delta analog-to-digital converter comprising:
       a plurality of integrator stages, one of the integrator stages comprising a current buffer that drives an integrating capacitor;
       an outer feedback digital-to-analog converter to provide a feedback signal; and
       an inner feedback current-mode digital-to-analog converter to convert the digital output signal to an analog current feedback signal that is provided to an output of the integrator stage that includes the current buffer, in which both the analog current feedback signal and an input signal provided to the current buffer are integrated by the integrating capacitor.

2. The apparatus of claim 1 in which the plurality of integrator stages comprises three integrator stages.

3. The apparatus of claim 1 in which the outer feedback digital-to-analog converter comprises a non-return-to-zero digital-to-analog converter.

4. The apparatus of claim 1 in which the current-mode digital-to-analog converter comprises a return-to-zero digital-to-analog converter.

5. The apparatus of claim 1 in which the current buffer receives an input current signal from a transconductance cell (Gm).

6. The apparatus of claim 1 in which the current buffer receives an input current signal from a resistor.

7. The apparatus of claim 1 in which the current-mode digital-to-analog converter comprises a two-state digital-to-analog converter that comprises one or more elements each having two states.

8. The apparatus of claim 1 in which the current-mode digital-to-analog converter in the inner feedback loop comprises a three-state digital-to-analog converter that comprises one or more elements each having three states.

9. The apparatus of claim 1 in which the outer feedback digital-to-analog converter is part of an outer feedback loop, the inner digital-to-analog converter is part of an inner feedback loop.

10. The apparatus of claim 1 in which the integrator stage that has the current buffer generates an output signal that is provided to an input of a quantizer that generates the digital output signal.

11. The apparatus of claim 1 in which the integrator stage that has the current buffer generates an output signal that is provided to another integrator stage.

12. The apparatus of claim 1, comprising a dynamic element matching block coupled in series with the outer feedback digital-to-analog converter.

13. An apparatus comprising:
    a continuous-time sigma-delta analog-to-digital converter comprising:
       a first integrator stage;
       a second integrator stage to receive an output from the first integrator stage;
       a third integrator stage to receive an output from the second integrator stage;
       an outer feedback loop comprising a digital-to-analog converter to convert a quantized output signal to an analog signal that is fed back to an input of the first integrator stage; and
       an inner feedback loop comprising a current-mode digital-to-analog converter to convert the quantized output signal to an analog current feedback signal that is provided to an output of one of the integrator stages such that the analog current feedback signal and the input of that integrator stage are both integrated by the integrator stage.

14. The apparatus of claim 13 in which the second integrator stage comprises a current buffer and an integrating capacitor, and the analog current feedback signal is provided to the output of the second integrator stage.

15. The apparatus of claim 13 in which the third integrator stage comprises a current buffer and an integrating capacitor, and the analog current feedback signal is provided to the output of the third integrator stage.

16. An apparatus comprising:
a continuous-time sigma-delta analog-to-digital converter comprising:
  a first integrator stage;
  a second integrator stage comprising a current amplifier driving an integrating capacitor;
  an outer feedback loop that includes a first digital-to-analog converter to convert a digital output signal to a first analog feedback signal that is provided to the first integrator stage; and
  an inner feedback loop that includes a current-mode digital-to-analog converter to convert the quantized output signal to an analog current feedback signal that is provided to an output of the second integrator stage, in which both the current feedback signal and an input signal of the current amplifier in the second integrator stage are integrated by the integrating capacitor in the second integrator stage.

17. The apparatus of claim 16 in which the continuous-time sigma-delta analog-to-digital converter comprises a third order continuous-time sigma-delta analog-to-digital converter having an intermediate integrator stage between the first and second integrator stages.

18. The apparatus of claim 16 in which the continuous-time sigma-delta analog-to-digital converter comprises a fourth order continuous-time sigma-delta analog-to-digital converter having a first intermediate integrator stage and a second intermediate integrator stage between the first and second integrator stages.

19. A method comprising:
converting an analog input signal to a digital output signal using a continuous-time sigma-delta analog-to-digital converter, the analog-to-digital converter comprising a first integrator stage and a second integrator stage, the second integrator stage comprising a current amplifier that drives an integrating capacitor, including
  converting the digital output signal to a first analog feedback signal that is provided to the first integrator stage;
  converting the digital output signal to a second analog feedback signal that is provided to an output of the second integrator stage; and
  integrating, using the integrating capacitor, both an input signal provided to the current amplifier and the second analog feedback signal.

20. The method of claim 19 in which the continuous-time sigma-delta analog-to-digital converter comprises a third order continuous-time sigma-delta analog-to-digital converter having an intermediate integrator stage between the first and second integrator stages.

21. The method of claim 19 in which the continuous-time sigma-delta analog-to-digital converter comprises a fourth order continuous-time sigma-delta analog-to-digital converter having a first intermediate integrator stage and a second intermediate integrator stage between the first and second integrator stages.

22. The method of claim 19 in which converting the digital output signal to the first analog feedback signal comprises maintaining the analog feedback signal level throughout a clock cycle without setting the signal to zero prior to a next clock cycle.

23. The method of claim 19 in which converting the digital output signal to the second analog feedback signal comprises setting the analog feedback signal to zero prior to a next clock cycle.

24. The method of claim 19 in which converting the digital output signal to the second analog feedback signal comprises using a two-state digital-to-analog converter that comprises one or more elements each having two states.

25. The method of claim 19 in which converting the digital output signal to the second analog feedback signal comprises using a three-state digital-to-analog converter that comprises one or more elements each having three states.

26. The method of claim 19, comprising providing the output of the current amplifier of the second integrator stage to a quantizer that generates the digital output signal.

27. The method of claim 19, comprising providing the output of the current amplifier of the second integrator stage to another integrator stage.

28. A method comprising:
converting an analog input signal to a digital output signal using a continuous-time sigma-delta analog-to-digital converter that comprises:
  a plurality of integrator stages,
  an outer feedback loop, and
  an inner feedback loop; and
reducing a delay in the inner feedback loop by providing a feedback signal of the inner feedback loop as an analog current feedback signal to an output of one of the integrator stages that comprises a current buffer and an integrating capacitor, and using the integrating capacitor to integrate the analog current feedback signal together with an input signal to the integrating stage having the current buffer and the integrating capacitor.

29. The method of claim 28 in which providing the feedback signal of the inner feedback loop comprises converting the digital output signal to the analog current feedback signal at each clock cycle, and maintaining the analog feedback signal level throughout the clock cycle without setting the signal to zero prior to a next clock cycle.

30. The method of claim 28 in which providing the feedback signal of the inner feedback loop comprises converting the digital output signal to the analog current feedback signal at each clock cycle, and setting the analog feedback signal to zero prior to a next clock cycle.

31. The method of claim 28, comprising providing the output of the integrator stage having the current buffer and the integrating capacitor to a quantizer that generates the digital output signal.

32. The method of claim 28, comprising providing the output of the integrator stage having the current buffer and the integrating capacitor to another integrator stage.

33. An apparatus comprising:
a continuous-time sigma-delta analog-to-digital converter to convert an analog input signal to a digital output signal, the continuous-time sigma-delta analog-to-digital converter comprising:
  a plurality of integrator stages, one of the integrator stages comprising a current buffer that drives an integrating capacitor;

an outer feedback digital-to-analog converter to provide a first feedback signal; and means for converting the digital output signal to an analog current feedback signal that is provided to an output of the integrator stage having the current buffer and the integrating capacitor, and integrating both the analog current feedback signal and an input signal provided to the integrator stage having the current buffer and the integrating capacitor.

* * * * *